United States Patent
Ho et al.

(10) Patent No.: US 8,704,586 B2
(45) Date of Patent: Apr. 22, 2014

(54) CAPACITANCE DETECTING APPARATUS AND CAPACITIVE TOUCH CONTROL SYSTEM USING THE SAME

(75) Inventors: Kai-Ting Ho, Zhubei (TW); Guo-Kiang Hung, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/572,905

(22) Filed: Aug. 13, 2012

(65) Prior Publication Data
US 2013/0229224 A1    Sep. 5, 2013

(30) Foreign Application Priority Data
Mar. 5, 2012 (TW) ............... 101107381 A

(51) Int. Cl.
*H03K 17/96* (2006.01)
(52) U.S. Cl.
USPC ........................................ 327/517
(58) Field of Classification Search
USPC ............ 327/337, 339, 361, 509, 517
See application file for complete search history.

(56) References Cited

U.S. PATENT DOCUMENTS

| | | | | |
|---|---|---|---|---|
| 5,641,911 | A | * | 6/1997 | Ryhanen .................. 73/718 |
| 6,257,061 | B1 | * | 7/2001 | Nonoyama et al. ........ 73/514.32 |
| 7,795,881 | B2 | * | 9/2010 | Masuda et al. ............ 324/661 |
| 2010/0110040 | A1 | * | 5/2010 | Kim et al. ................. 345/174 |

* cited by examiner

*Primary Examiner* — Jeffrey Zweizig
(74) *Attorney, Agent, or Firm* — Edell, Shapiro & Finnan, LLC

(57) ABSTRACT

A capacitance detecting apparatus, coupled to a capacitor to be measured, includes a first capacitor, a second capacitor, a control module and a judging module. The first and second capacitors are coupled to the capacitor to be measured via an input node. The control module provides a first voltage-drop variation to the first capacitor and a second voltage-drop variation to the capacitor to be measured to introduce a third voltage-drop variation to the second capacitor. The first and second voltage-drop variations cause charge flowing from the first capacitor to the input node have a same sign with charge flowing from the input node to the capacitor to be measured. The judging module determines capacitance of the capacitor to be measured according to capacitance of the first and second capacitors as well as the first, second and third voltage-drop variations.

12 Claims, 5 Drawing Sheets

CAPACITANCE DETECTING APPARATUS AND CAPACITIVE TOUCH CONTROL SYSTEM USING THE SAME

This application claims the benefit of Taiwan application Serial No. 101107381, filed Mar. 5, 2012, the subject matter of which is incorporated herein by reference.

BACKGROUND OF THE INVENTION

1. Field of the Invention

The invention relates in general to a measuring technique, and more particularly, to a circuit for detecting and measuring capacitance.

2. Description of the Related Art

Operating interfaces of recent electronic products have become more and more user-friendly and intuitive as technology advances. For example, via a touch screen, a user can directly operate programs as well as input messages/texts/patterns using fingers or a touch control pen, which is often easier than operating such programs or entering input via traditional input devices, such as a keyboard or buttons. In practice, a touch screen usually comprises a touch sensing panel and a display disposed at the back of the touch sensing panel. According to a position of a touch on the touch sensing panel and a currently displayed image on the display, an electronic device determines an intention of the touch to execute corresponding operations.

For a capacitive touch device, a touch affects an electric field of a touch point triggering a corresponding capacitance change. Thus, the sensitivity and accuracy of detecting and measuring the capacitance change are critical. Referring to FIG. 1A, a block 100 is a conventional capacitance detecting circuit. The capacitance detecting circuit comprises an operational amplifier 12, a pad 14, a feedback capacitor Cfb, two first switches SW1, and a second switch SW2. The pad 14 connects an external capacitor Cx to be measured outside the detecting circuit 100 to the operational amplifier 12. The capacitor Cx to be measured is located in a sensing panel, and reflects a capacitance change according to a user's touch.

In a first stage of the detection process, both of the first switches SW1 are turned on, and the second switch SW2 is turned off. The circuit in FIG. 1A is equivalent to a circuit shown in FIG. 1B. Under such conditions, the voltages at an output terminal Vout as well as positive and negative input terminals of the operational amplifier 12 are all equal to a reference voltage VL. Thus, the feedback capacitor Cfb is discharged to store no charge, whereas the capacitor Cx to be measured is charged to store charge Cx*VL. In a second stage of the detection process, both of the first switches SW1 are turned off, and the second switch SW is turned on. In this latter configuration, the circuit in FIG. 1A is equivalent to a circuit shown in FIG. 1O. Under such conditions, the voltages at the positive and negative input terminals of the operational amplifier 12 both become a reference voltage VH. After redistributing the charge, the voltage at the output terminal is represented as:

$$Vout = VH + (VH - VL) * \frac{Cx}{Cfb} \quad (1)$$

With known values of the reference voltages VL and VH and the feedback capacitor Cfb, a value of capacitor Cx to be measured can be deduced according to the output voltage Vout. By further dismantling the capacitor Cx to be measured into a background capacitance Cbg existent prior to the user influence and a capacitance change Csig generated by the users touch, Equation (1) can be rewritten as:

$$Vout = VH + (VH - VL) * \frac{Cbg}{Cfb} + (VH - VL) * \frac{Csig}{Cfb} \quad (2)$$

The background capacitance Cbg is substantially a fixed value, meaning that the main target to be measured is the capacitance change Csig. The feedback capacitance cannot be too small so as to prevent the output voltage Vout from saturation. However, it is observed from the last item in Equation (2) that the resolution of measuring the capacitance change Csig worsens as the feedback capacitance Cfb becomes larger.

SUMMARY OF THE INVENTION

To overcome the foregoing issue, a capacitance detecting apparatus and a capacitive touch control system using the capacitance detecting apparatus are provided by embodiments of the present invention. By appropriately providing charge required by a capacitor to be measured in a charge redistribution process using an additional capacitor apart from a feedback capacitor, the capacitance detecting apparatus according to the embodiments of the present invention is capable of maintaining a satisfactory measuring resolution and preventing output voltage saturation. It should be noted that parasitic capacitance between existing connecting wires and a shielding layer on circuit board may be utilized as the additional capacitor to further reduce a chip size of the apparatus.

A capacitance detecting apparatus is provided according to one embodiment of the present invention. The capacitance detecting apparatus is coupled to a capacitor to be measured, and comprises a first capacitor, a second capacitor, both part of a control module, and a judging module. The first capacitor and the second capacitor are coupled to the capacitor to be measured via an input node. The control module provides a first voltage-drop variation to the first capacitor and a second voltage-drop variation to the capacitor to be measured to introduce a third voltage-drop variation to the second capacitor. The first voltage-drop variation and the second voltage-drop variation cause the charge flowing from the first capacitor to the input node to have a same sign with the charge flowing from the input node to the capacitor to be measured. The judging module determines capacitance of the capacitor to be measured according to capacitance of the first capacitor, capacitance of the second capacitor, the first voltage-drop variation, the second voltage-drop variation and the third voltage-drop variation.

A capacitance touch control system is provided according to another embodiment of the present invention. The capacitance touch control system comprises a display device, a plurality of sensing capacitors, a first capacitor, a second capacitor, both part of a control module, and a judging module. The plurality of sensing capacitors respectively correspond to a plurality of physical positions on the display device. The first capacitor and the second capacitor are coupled to one of the sensing capacitors via an input node, where the coupled sensing capacitor is the capacitor to be measured. The control module provides a first voltage-drop variation to the first capacitor and a second voltage-drop variation to the capacitor to be measured to incur a third voltage-drop variation of the second capacitor. The first voltage-drop variation and the second voltage-drop variation cause the charge flowing from the first capacitor to the input node to have a same sign with the charge flowing from the input node to the capacitor to be measured. The judging module determines capacitance of the capacitor to be measured according to capacitance of the first capacitor, capacitance of the second capacitor, the first voltage-drop variation, the second voltage-drop variation and the third voltage-drop variation.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1A:
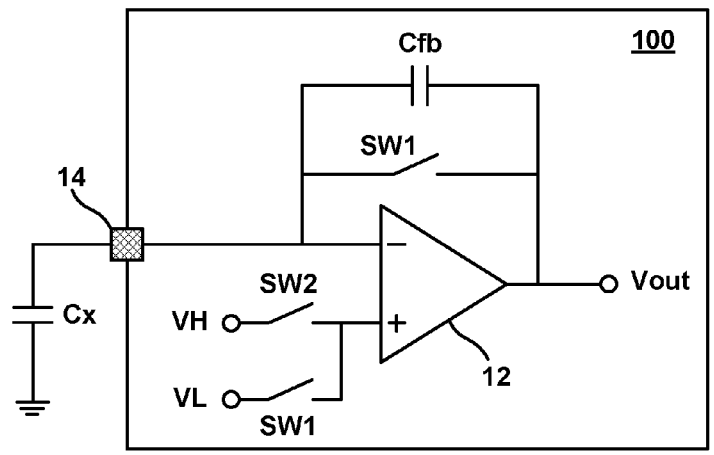
FIGS. 1A to 1C depict configurations of a conventional capacitance detecting circuit.
Figure 1B:
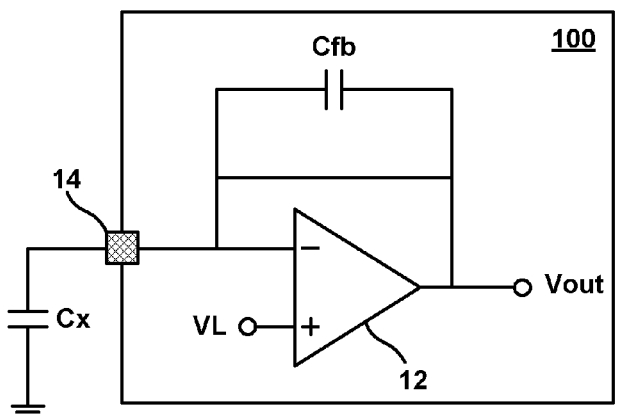
Figure 1C:
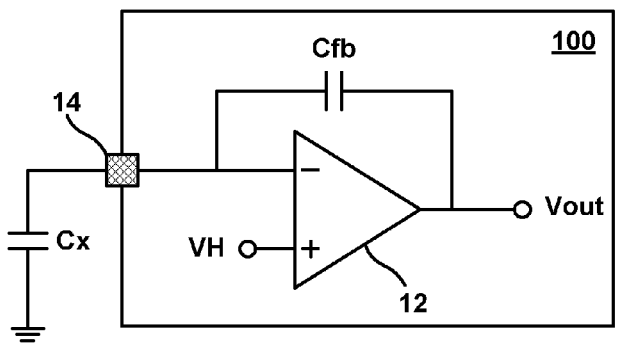
Figure 2A:
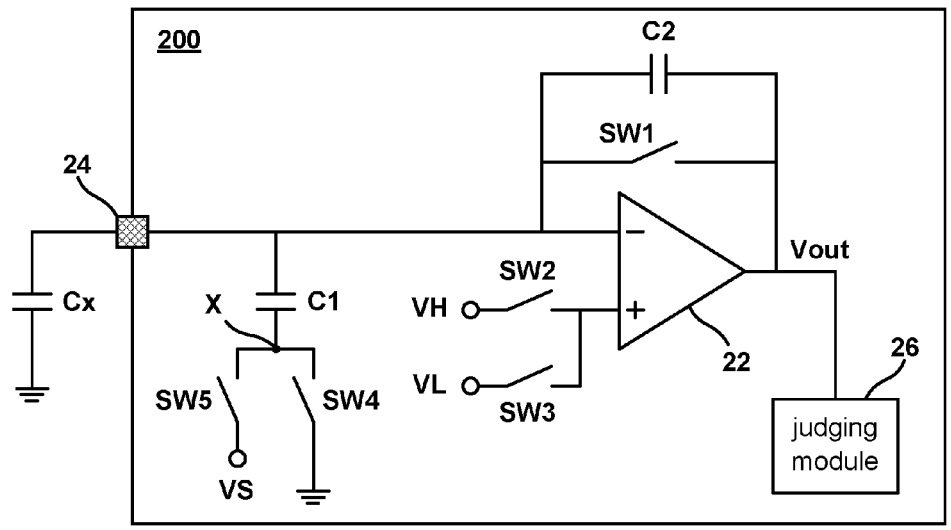
FIGS. 2A to 2C show a capacitance detecting apparatus and state changes according to one embodiment of the present invention.

FIG. 2A shows a capacitance detecting apparatus 200 according to one embodiment of the present invention. The capacitance detecting apparatus 200 comprises two capacitors C1 and C2, five switches SW1 to SW5, an operational amplifier 22, an input node 24 and a judging module 26. The foregoing elements, except for the judging module 26, may be referred to herein, collectively, as a "control module." A capacitor to be measured Cx is coupled to capacitance detecting apparatus 200 via the input node 24. When the capacitance detecting apparatus 200 and the capacitor to be measured Cx are not packaged in a same chip, the input node 24 may be a pad, for example. In practice, the capacitance detecting apparatus 200 may be an independent device, or may be integrated in a system with a capacitance detection requirement.

Figure 2B:
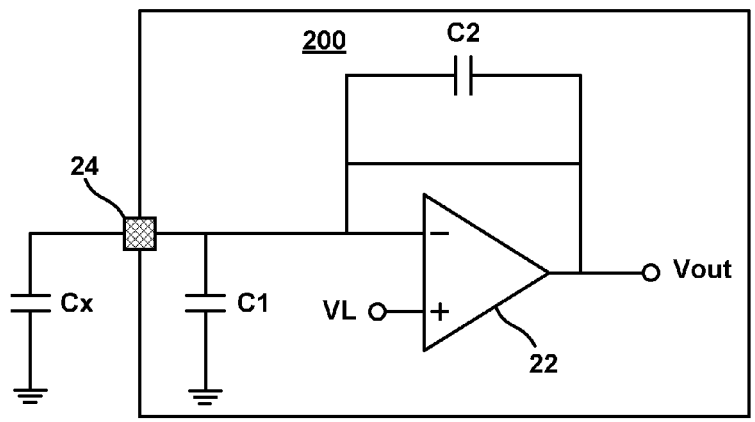

The states of the switches SW1 to SW5 may be determined by a switching control module (not shown). In a first stage of the detection process, the switches SW1, SW3 and SW4 are turned on (short-circuit), whereas the switches SW2 and SW5 are turned off (open-circuit). The circuit in FIG. 2A is equivalent to a circuit shown in FIG. 2B (with the judging module 26 ignored temporarily). Under such conditions, the voltages at an output terminal Vout as well as the positive and negative input terminals of the operational amplifier 22 are all equal to a reference voltage VL. The capacitor C2 is discharged to zero charge, the capacitor C1 is charged to store charge C1*VL, and the capacitor Cx to be measured is charged to store charge Cx*VL.

Figure 2C:
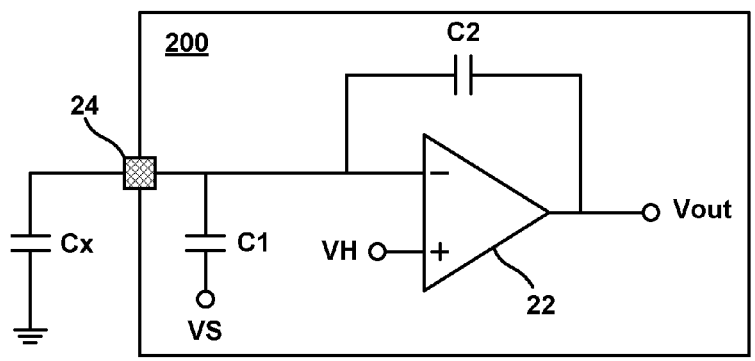

In a second stage of the detection process, the switches SW1, SW3 and SW4 are turned off, whereas the switches SW2 and SW5 are turned on. The circuit in FIG. 2A is equivalent to a circuit shown in FIG. 2C (with the judging module 26 ignored temporarily). Under such conditions, the voltages at the positive and negative input terminals of the operational amplifier 22 are equal to a reference voltage VH, and a control node X at one side of the capacitor C1 is switched to couple to a control voltage VS.

The switching of the switches between the above two stages causes voltage-drop variations in the capacitors to lead to charge redistribution among the capacitors C1, C2 and Cx. A charge balance corresponding to the input node 24 may be represented as:

$$(VS+VL-VH)*C1+(Vout-VH)*C2=(VH-VL)*Cx \quad (3)$$

In this embodiment, the reference voltage VH is higher than the reference voltage VL, and the control voltage VS is designed to be higher than (VH−VL). Therefore, it can be seen from Equation (3) that the current flows from the input node 24 to the capacitor Cx to be measured and flows from the capacitor C1 to the input node 24 in the second stage. In other words, the positive charge flowing from the input node 24 to the capacitor Cx to be measured is partly contributed by the positive charge flowing from the capacitor C1 to the input node 24. Observing from the capacitor C2, when Vout is greater than VH, the current flows from the capacitor C2 to the input node 24, i.e., the charge flowing from the capacitor C2 to the input node 24 is positive; when Vout is smaller than VH, the current flows from the input node 24 to the capacitor C2, i.e., the charge flowing from the capacitor C2 to the input node 24 is negative. Different from a situation in FIG. 10 in which the charge change in the capacitor Cx to be measured is entirely contributed by the feedback capacitor Cfb, the charge change in the capacitor Cx to be measured in this embodiment is jointly contributed by the capacitors C1 and C2.

Equation (3) can be rewritten as:

$$Vout = VH + (VH - VL) * \frac{Cx}{C2} - (VS + VL - VH) * \frac{C1}{C2} \quad (4)$$

With known values of the voltages VL, VH and VS as well as the capacitors C1 and C2, a value of capacitor to be measured Cx can be estimated by the judging module 26 according to the output voltage Vout or a the voltage-drop variation between two terminals of the capacitor C2. By further dismantling the capacitor Cx to be measured into a summation of a background capacitance Cbg (existent prior to the user influence) and a capacitance change Csig generated by the user touch, Equation (4) can be rewritten as:

$$Vout = \\ VH + (VH - VL) * \frac{Cbg}{C2} + (VH - VL) * \frac{Csig}{C2} - (VS + VL - VH) * \frac{C1}{C2} \quad (5)$$

It can be seen from Equation (5) that, since the reference voltage VH is higher than the reference voltage VL, and the control voltage VS is designed to be higher than (VH−VL), the charge contributed by the capacitor C1 eliminates the charge contributed by the background capacitance Cbg, such that the voltage Vout is less likely to reach saturation. Therefore, even when a smaller capacitor C2 is selected to increase the resolution of the capacitance change Csig, the voltage Vout does not reach saturation easily. In other words, by selecting an appropriate capacitor C1, the capacitance detecting apparatus 200 is able to provide a satisfactory measuring resolution without incurring output voltage saturation.

From a perspective of charge distribution, the capacitance detecting apparatus 200 is characterized in utilizing the charge flowing from the capacitor C1 to the input node 24 as the charge flowing from the input node to the background capacitance Cbg to achieve charge elimination, so that the voltage Vout is less likely to reach saturation. Given that the reference voltage VH is higher than the reference voltage VL and the control voltage VS is designed to be higher than (VH−VL), the charge flowing from the capacitor C1 to the input node 24 is positive (i.e., the current flows from the capacitor C1 to the input node 24), and the charge flowing from the input node 24 to the background capacitance Cbg is also positive (i.e., the current flows from the input node 24 to the background capacitance Cbg). In contrast, given that the reference voltage VH is lower than the reference voltage VL and the control voltage VS is designed to be lower than (VH−VL), the charge flowing from the capacitor C1 to the input node 24 is negative (i.e., the current flows from the input node 24 to the capacitor C1), and the charge flowing from the input node 24 to the background capacitance Cbg is also negative (i.e., the current flows from the input node 24 to the background capacitance Cbg), thereby similarly achieving charge elimination. In conclusion, with an appropriate design for the voltage-drop variations of the capacitors, the charge flowing from the capacitor C1 to the input node 24 and the charge flowing from the input node 24 to the capacitor Cx to be measured may both be positive or negative, so as to maintain a satisfactory measuring resolution without causing output voltage saturation.

Figure 3A:
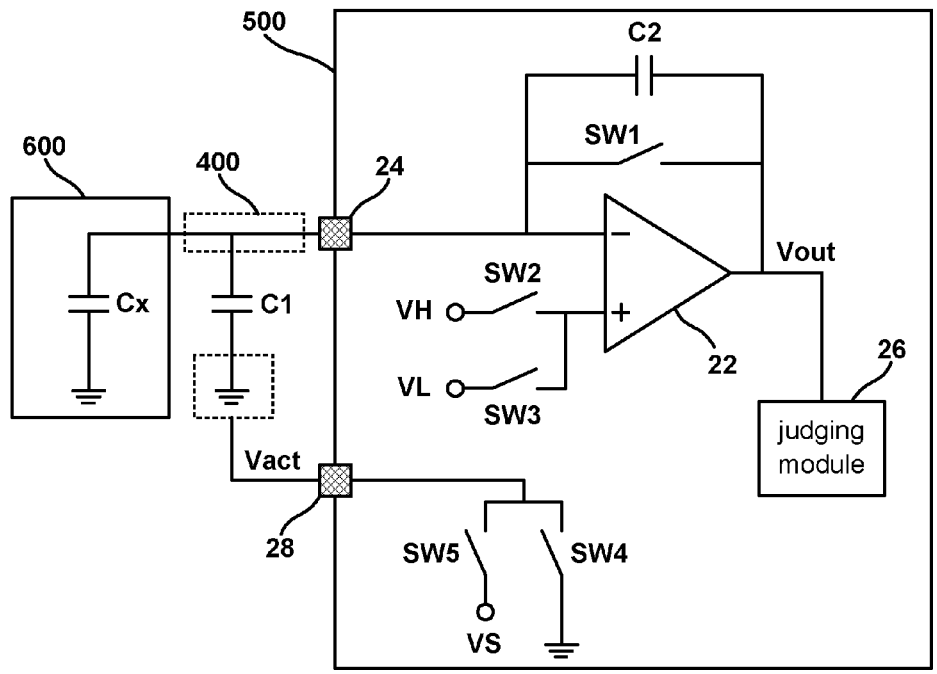
FIGS. 3A to 3C are examples of a capacitance detecting apparatus utilizing an external capacitor according to one embodiment of the present invention.

FIG. 3A shows a capacitance detecting apparatus according to another embodiment of the present invention. In this embodiment, a capacitor C1 is disposed outside a chip 500, comprising an operational amplifier 22. In fact, whether the capacitor C1 and the operational amplifier 22 are packaged in a same chip or not has little influence on the foregoing effect. It should be noted that, the capacitor C1 in this embodiment is implemented by parasitic capacitance of a connecting wire 400. Taking a capacitive touch control device as an example, the capacitor Cx to be measured is usually formed on a sensing panel 600 (e.g., a block 600 in the diagram), and is coupled to the chip 500 via the connecting wire 400 on a flexible circuit board or a printed circuit board.

In this embodiment, the circuit board where the connecting wire 400 is located has a shielding layer, and parasitic capacitance existing between the connecting wire 400 and the shielding layer is regarded as the capacitor C1. Referring to FIG. 3A, the circuit board where the connecting wire 400 is located further includes an adjustable ground level Vact, which is coupled to switches SW4 and SW5 in the chip 500 via a pad 28. By turning on and off the switches SW4 and SW5, the control module in the capacitance detecting apparatus according to this embodiment of the present invention changes the voltage-drop of the capacitor C1. In other words, the voltage-drop variation of the capacitor C1 can be implemented by controlling the ground level Vact of the shielding layer. It should be noted that, the size of the parasitic capacitance (i.e., the capacitor C1) can be precisely estimated and controlled by controlling features of the connecting wire 400, including the shape, length and thickness. That is to say, by controlling the connecting wire 400 and the shielding layer, the ground level Vact and the parasitic capacitance (i.e., the capacitor C1) can be flexibly adjusted to control the voltage-drop variation of the capacitor C1. In another embodiment, by active shielding or subtraction, the capacitor C1, corresponding to ground level Vact of the shielding layer, may be equivalently identified. Advantages of such approach are that the space occupied by the capacitor C1 in the chip can be saved, and the originally redundant or undesirable parasitic capacitance is put to good use.

Figure 3B:
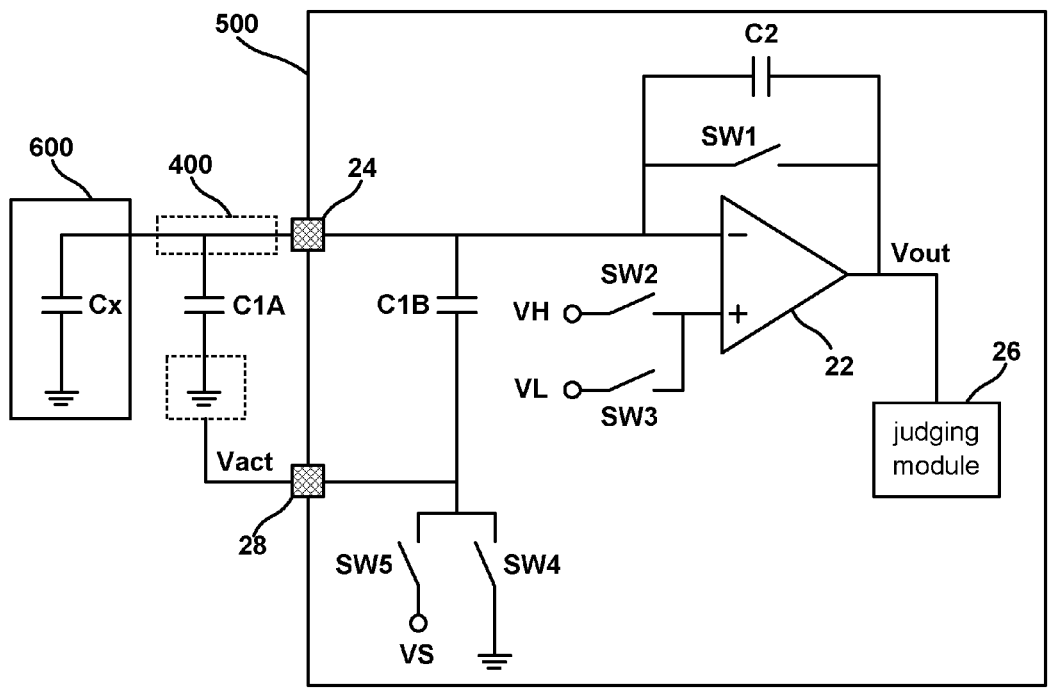

Referring to FIG. 3B, in another embodiment, a capacitor C1 may also be divided into two parts—a capacitor C1A disposed outside a chip 500 and a capacitor C1B packaged inside the chip 500. The capacitor C1B is mainly for compensating an error of the capacitor C1A caused by manufacturing variances needs not be too large. For example, the capacitor C1B need not be too large and may be, e.g., 1 pF to 2 pF.

Figure 3C:
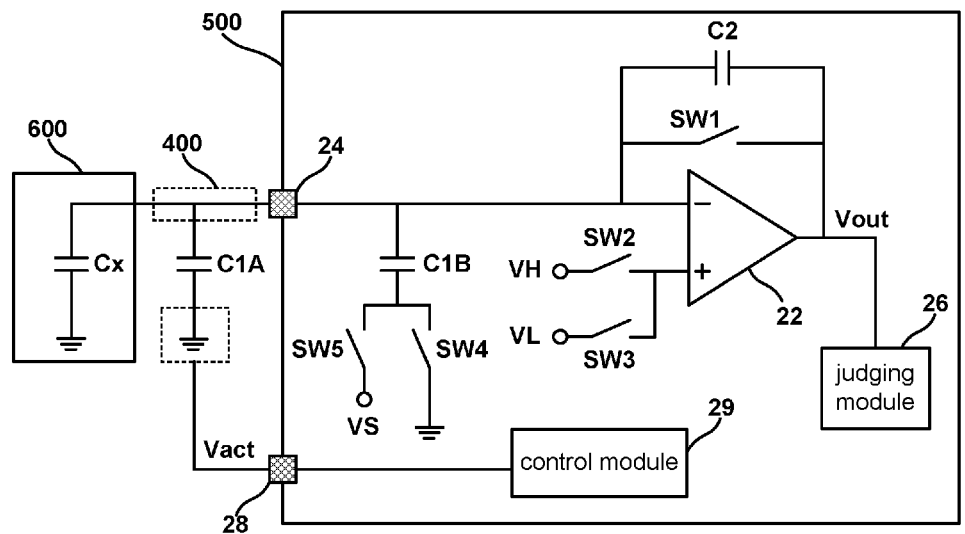

Referring to FIG. 3C, in another embodiment, capacitors C1A and C1B may be controlled by different control voltages. In this embodiment, when a switch SW5 is turned on, the capacitor C1B is coupled to a voltage supply providing a control voltage VS, while a voltage of the capacitor C1A is controlled by a control module 29. Similarly, given that the charge flowing from the capacitor C1A and C1B to the input node 24 and the charge flowing from the input node 24 to the capacitor Cx to be measured are both positive or negative, a satisfactory measuring resolution can be maintained without causing output voltage saturation.

Figure 4A:
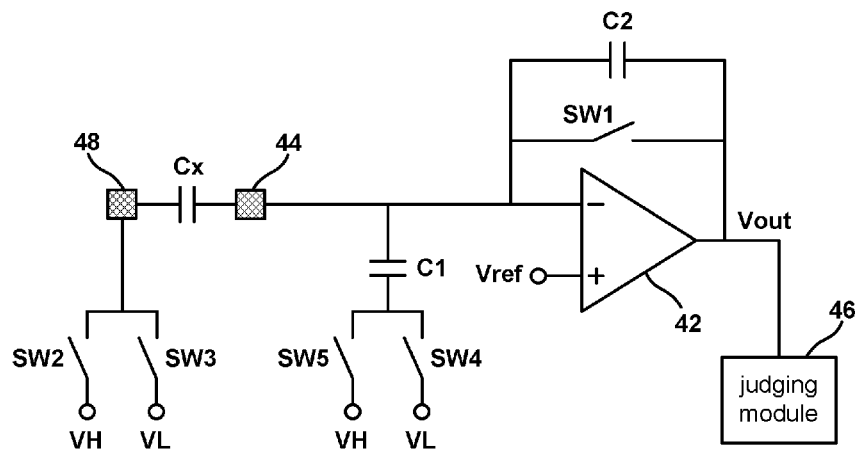
FIGS. 4A to 4C are examples of a capacitance detecting apparatus and state changes according to another embodiment of the present invention.

The foregoing embodiments are examples in which the voltage at the input node 24 varies. In practice, the voltage at the input node 24 may also be a fixed value, as an embodiment shown in FIG. 4A. Referring to FIG. 4A, the switches SW1 to SW5 may be controlled by a switching control module (not shown), and two terminals of a capacitor Cx to be measured are respectively coupled to the capacitance detecting apparatus according to this embodiment via an input node 44 and a driving node 48.

Figure 4B:
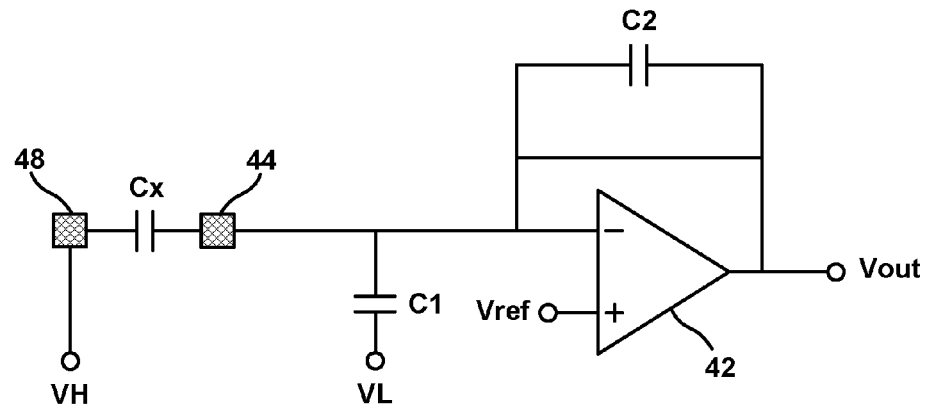

In a first stage of the detection process, the switches SW1, SW2 and SW4 are turned on, whereas the switches SW3 and SW5 are turned off. The circuit in FIG. 4A is equivalent to a circuit shown in FIG. 4B (with a judging module 26 ignored temporarily). Under such conditions, the voltages at an output terminal Vout as well as the positive and negative input terminals of the operational amplifier 22 are equal to a reference voltage Vref. The capacitor C2 is discharged and does not store any charge, the capacitor C1 is charged to store charge C1*(VL−Vref), and the capacitor Cx to be measured is charged to store charge Cx*(VH−Vref).

Figure 4C:
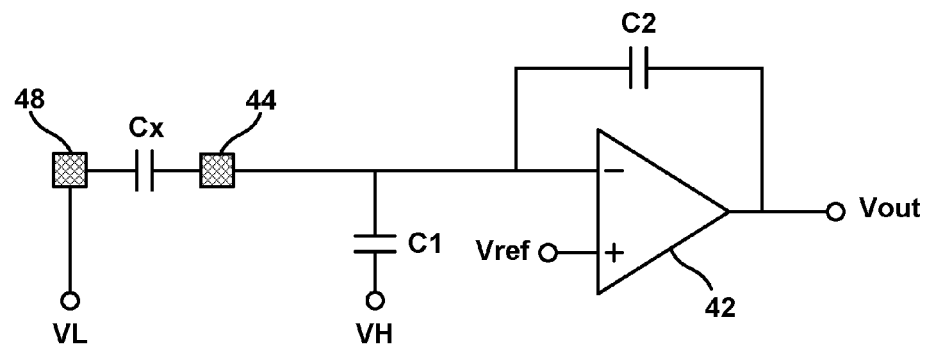

In a second stage of the detection process, the switches SW1, SW3 and SW4 are turned off, whereas the switches SW2 and SW5 are turned on. The circuit in FIG. 4A is equivalent to a circuit shown in FIG. 4C (with the judging module 46 ignored temporarily). Under such conditions, the voltages at the positive and negative input terminals of the operational amplifier 22 remain equal to Vref, and a control node at one side of the capacitor C1 is switched to couple to a power supply providing the control voltage VH, and the driving node 48 is switched to couple to a power supply providing the control voltage VL.

The switching of the switches in the above two stages causes voltage-drop varies in the capacitors to lead to charge redistribution among the capacitors C1, C2 and Cx. A charge balance corresponding to the input node 44 may be represented as:

$$(VH-VL)*C1+(Vout-Vref)*C2=(VH-VL)*Cx \qquad (6)$$

In this embodiment, the reference voltage VH is higher than the reference voltage VL. Therefore, it can be seen from Equation (6) that, the current flows from the input node 44 to the capacitor Cx to be measured and flows from the capacitor C1 to the input node 44 in the second stage. In other words, the positive charge flowing from the input node 44 to the capacitor Cx to be measured is partly contributed by the positive charge flowing from the capacitor C1 to the input node 44. Observing from the capacitor C2, when Vout is greater than Vref, the current flows from the capacitor C2 to the input node 44, i.e., the charge flowing from the capacitor C2 to the input node 44 is positive; when Vout is smaller than Vref, the current flows from the input node 44 to the capacitor C2, i.e., the charge flowing from the capacitor C2 to the input node 44 is negative. Variation of the charge in the capacitor Cx to be measured in this embodiment is jointly contributed by the capacitors C1 and C2.

Equation (6) can be rewritten as:

$$Vout = Vref + (VH - VL) * \frac{Cx}{C2} - (VH - VL) * \frac{C1}{C2} \quad (7)$$

With known values of the voltages VL, VH and VS as well as the capacitors C1 and C2, a value of capacitor Cx to be measured can be estimated by the judging module 46 according to the output voltage Vout or the voltage-drop variation between two terminals of the capacitor C2 (from 0 to Vout−Vref). By further dismantling the capacitor Cx to be measured into a background capacitance Cbg and a capacitance change Csig generated by the users touch, Equation (7) can be rewritten as:

$$Vout = Vref + (VH - VL) * \frac{Cbg}{C2} + (VH - VL) * \frac{Csig}{C2} - (VH - VL) * \frac{C1}{C2} \quad (8)$$

It can be seen from Equation (8) that the charge contributed by the capacitor C1 eliminates the charge contributed by the background capacitance Cbg, such that the voltage Vout is less likely to reach saturation. Therefore, even when a smaller capacitor C2 is selected to increase the resolution of the capacitance change Csig, the voltage Vout does not reach saturation easily. In other words, by selecting an appropriate capacitor C1, the capacitance detecting apparatus 200 is able to provide a satisfactory measuring resolution without incurring output voltage saturation.

The capacitance detecting apparatus shown in FIG. 4A may be implemented in a mutual-capacitive touch control system. More specifically, the input node 44 may be coupled to a sensing electrode in the mutual-capacitive touch control system, and mutual capacitance between the sensing electrode and a driving electrode is regarded as the capacitor to be measured Cx. The voltage provided to the driving node 48 is in equivalence to a driving signal. Further, similarly to the foregoing embodiments, the capacitor C1 in FIG. 4A may comprises the parasitic capacitance between the shielding layer and the connecting wire.

In conclusion, a concept of the capacitance detecting apparatus of the present invention is summarized as follows. A first voltage-drop variation is provided to a capacitor C1, and a second voltage-drop variation is provided to a capacitor to be measured Cx to introduce a third voltage-drop to a capacitor C2. Capacitance of the capacitor to be measured Cx is determined according to capacitance of the capacitors C1 and C2 as well as the voltage-drop variations. Through appropriate designs, the first voltage-drop variation and the second voltage-drop variation make charge flowing from the capacitor C1 to an input node and charge flowing from the input node to the capacitor to be measured Cx to have the same sign, both positive or negative, so that a satisfactory measuring resolution can be maintained without incurring output voltage saturation.

A capacitive touch control system is provided according to yet another embodiment of the present invention. The capacitive touch control system comprises a display device, a plurality of sensing capacitors and at least one capacitive detecting apparatus shown in FIG. 2A, FIG. 3A, FIG. 3B, FIG. 3C or FIG. 4A. The sensing electrodes respectively correspond to a physical position on the display device, and may be detected by the at least one capacitive detecting apparatus. Operation details of the capacitive detecting apparatus are as previously described in the foregoing embodiments, and shall be omitted herein.

Therefore, a capacitance detecting apparatus and a capacitive touch control system using the capacitance detecting apparatus are provided. By adding an additional capacitor apart from a feedback capacitor to provide required charges to a capacitor to be measured in a charge redistribution process, the capacitance detecting apparatus of the present invention is capable of maintaining a satisfactory measuring resolution and preventing output voltage saturation. In addition to a capacitive touch control system, the capacitance detecting apparatus may also be implemented to various situations with a capacitance detection demand.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A capacitance detecting apparatus, coupled to a capacitor to be measured, the apparatus comprising:
    a first capacitor and a second capacitor, coupled to the capacitor to be measured via an input node;
    a control module, for providing a first voltage-drop variation to the first capacitor and a second voltage-drop variation to the capacitor to be measured to introduce a third voltage-drop variation to the second capacitor; wherein the first voltage-drop variation and the second voltage-drop variation cause charge flowing from the first capacitor to the input node to have a same sign with charge flowing from the input node to the capacitor to be measured; and
    a judging module, for determining capacitance of the capacitor to be measured according to capacitance of the first capacitor, capacitance of the second capacitor, the first voltage-drop variation, the second voltage-drop variation and the third voltage-drop variation,
    wherein the capacitor to be measured is connected to the capacitance detecting apparatus via a connecting wire formed on a circuit board, the circuit board has a shielding layer, and the first capacitor comprises parasitic capacitance between the connecting wire and the shielding layer, and the control module controls the shielding layer to provide the first voltage-drop variation of the first capacitor.

2. The capacitance detecting apparatus according to claim 1, wherein the circuit board is a flexible circuit board or a printed circuit board.

3. The capacitance detecting apparatus according to claim 1, wherein the first capacitor is coupled between the input node and a control node, and the second capacitor is coupled between the input node and an output node; at a first time point, the control module provides a first input voltage to the input node and the output node, and provides a first control voltage to the control node; at a second time point, the control module provides a second input voltage to the input node, and provides a second control voltage to the control node; a difference between the first input voltage and the second input voltage is smaller than a difference between the first control voltage and the second control voltage.

4. The capacitance detecting apparatus according to claim 3, wherein the control module comprises:
an operational amplifier, comprising a first input terminal, a second input terminal and an output terminal, wherein the first input terminal is the input node and the output terminal is the output node;
a first switch, coupled between the first input terminal and the output terminal, being turned on at the first time point and turned off at the second time point;
a second switch, coupled between the second input terminal and a second input voltage supply, being turned off at the first time point and turned on at the second time point;
a third switch, coupled between the second input terminal and a first input voltage supply, being turned on at the first time point and turned off at the second time point;
a fourth switch, coupled between the control node and a ground terminal, being turned on at the first time point and turned off at the second time point; and
a fifth switch, coupled between the control node and a first control voltage supply, being turned off at the first time point and turned on at the second time point.

5. The capacitance detecting apparatus according to claim 1, wherein the capacitor to be measured is coupled between the input node and a driving node, the first capacitor is coupled between the input node and a control node, the second capacitor is coupled between the input node and an output node; at the first time point, the control module provides a reference voltage to the input node and the output node, provides a first voltage to the control node, and provides a second voltage to the driving node; at the second time point, the control module provides the reference voltage to the input node, provides the second voltage to the control node, and provides the first voltage to the driving node; wherein the first voltage is different from the second voltage.

6. The capacitance detecting apparatus according to claim 5, wherein the control module comprises:
an operational amplifier, comprising a first input terminal, a second input terminal and an output terminal; wherein the first input terminal is the input node, the output terminal is the output node, and the second input terminal is coupled to a reference voltage supply;
a first switch, coupled between the first input terminal and the output terminal, being turned on at the first time point and turned off at the second time point;
a second switch, coupled between the driving node and a second input voltage supply, being turned on at the first time point and turned off at the second time point;
a third switch, coupled between the driving node and a first input voltage supply, being turned off at the first time point and turned on at the second time point;
a fourth switch, coupled between the control node and the first voltage supply, being turned on at the first time point and turned off at the second time point; and
a fifth switch, coupled between the control node and the second voltage supply, being turned off at the first time point and turned on at the second time point.

7. A capacitive touch control system, comprising:
a display device;
a plurality of sensing capacitors, respectively corresponding to a plurality of physical positions on the display device;
a first capacitor and a second capacitor, coupled to one of the plurality of sensing capacitors via an input node; wherein the one sensing capacitor is a capacitor to be measured;
a control module, for providing a first voltage-drop variation to the first capacitor and a second voltage-drop variation to the capacitor to be measured to incur a third voltage-drop variation of the second capacitor; wherein the first voltage-drop variation and the second voltage-drop variation cause charge flowing from the first capacitor to the input node to have a same sign with charge flowing from the input node to the capacitor to be measured; and
a judging module, for determining capacitance of the capacitor to be measured according to capacitance of the first capacitor, capacitance of the second capacitor, the first voltage-drop variation, the second voltage-drop variation and the third voltage-drop variation,
wherein the first capacitor and second capacitor are coupled to the capacitor to be measured via a connecting wire formed on a circuit board, the circuit board comprises a shielding layer, the first capacitor comprises a parasitic capacitance between the connecting wire and the shielding layer, and the control module controls the shielding layer to provide the first voltage-drop variation of the first capacitor.

8. The capacitive touch control system according to claim 7, wherein the circuit board is a flexible circuit board or a printed circuit board.

9. The capacitive touch control system according to claim 7, wherein the first capacitor is coupled between the input node and a control node, and the second capacitor is coupled between the input node and an output node; at a first time point, the control module provides a first input voltage to the input node and the output node, and provides a first control voltage to the control node; at a second time point, the control module provides a second input voltage to the input node, and provides a second control voltage to the control node; wherein a difference between the first input voltage and the second input voltage is smaller than a difference between the first control voltage and the second control voltage.

10. The capacitive touch control system according to claim 9, wherein the control module comprises:
an operational amplifier, comprising a first input terminal, a second input terminal and an output terminal, wherein the first input terminal is the input node and the output terminal is the output node;
a first switch, coupled between the first input terminal and the output terminal, being turned on at the first time point and turned off at the second time point;
a second switch, coupled between the second input terminal and a second input voltage supply, being turned off at the first time point and turned on at the second time point;
a third switch, coupled between the second input terminal and a first input voltage supply, being turned on at the first time point and turned off at the second time point;
a fourth switch, coupled between the control node and a ground terminal, being turned on at the first time point and turned off at the second time point; and
a fifth switch, coupled between the control node and a first control voltage supply, being turned off at the first time point and turned on at the second time point.

11. The capacitive touch control system according to claim 7, wherein the capacitor to be measured is coupled between the input node and a driving node, the first capacitor is coupled between the input node and a control node, the second capacitor is coupled between the input node and an output node; at the first time point, the control module provides a reference voltage to the input node and the output node, provides a first voltage to the control node, and provides a second voltage to the driving node; at the second time point, the control module provides the reference voltage to the input node, provides the second voltage to the control node, and provides the first voltage to the driving node; the first voltage is different from the second voltage.

12. The capacitive touch control system according to claim 11, wherein the control module comprises:
   an operational amplifier, comprising a first input terminal, a second input terminal and an output terminal; wherein the first input terminal is the input node, the output terminal is the output node, and the second input terminal is coupled to a reference voltage supply;
   a first switch, coupled between the first input terminal and the output terminal, being turned on at the first time point and turned off at the second time point;
   a second switch, coupled between the driving node and a second input voltage supply, being turned on at the first time point and turned off at the second time point;
   a third switch, coupled between the driving node and a first input voltage supply, being turned off at the first time point and turned on at the second time point;
   a fourth switch, coupled between the control node and the first voltage supply, being turned on at the first time point and turned off at the second time point; and
   a fifth switch, coupled between the control node and the second voltage supply, being turned off at the first time point and turned on at the second time point.

* * * * *